(12) United States Patent
Brockhaus et al.

(10) Patent No.: US 10,806,020 B2
(45) Date of Patent: Oct. 13, 2020

(54) DEVICE FOR RECEIVING AN ELECTRONICS ASSEMBLY

(71) Applicant: KROHNE Messtechnik GmbH, Duisburg (DE)

(72) Inventors: Helmut Brockhaus, Oberhausen (DE); Alexander Erkelenz, Moers (DE); Achim Matt, Duisburg (DE)

(73) Assignee: KROHNE MESSTECHNIK GMBH, Duisburg (DE)

(*) Notice: Subject to any disclaimer, the term of this patent is extended or adjusted under 35 U.S.C. 154(b) by 43 days.

(21) Appl. No.: 15/902,044

(22) Filed: Feb. 22, 2018

(65) Prior Publication Data

US 2018/0249571 A1 Aug. 30, 2018

(30) Foreign Application Priority Data

Feb. 27, 2017 (DE) .................. 10 2017 104 007

(51) Int. Cl.
*H05K 1/02* (2006.01)
*H05K 7/14* (2006.01)
*H05K 7/20* (2006.01)

(52) U.S. Cl.
CPC ......... *H05K 1/0203* (2013.01); *H05K 7/1422* (2013.01); *H05K 7/202* (2013.01); *H05K 2201/064* (2013.01)

(58) Field of Classification Search
CPC ......... H01L 23/467; H01L 2224/45124; H01L 2224/45147; G06F 1/20; G06F 1/203; G06F 2200/201; G06F 1/206; G06F 1/181; G06F 1/183; G06F 1/18; G06F 1/185; G06F 1/1601; H05K 7/20145; H05K 7/20736; H05K 7/20172; H05K 7/20972; H05K 7/20154; H05K 7/20136; H05K 7/20572; H05K 7/20718; H05K 7/20009; H05K 7/20781; H05K 7/20918; H05K 7/20909;
(Continued)

(56) References Cited

U.S. PATENT DOCUMENTS 4,126,269 A * 11/1978 Bruges .................. G05D 23/26
236/49.3
5,810,554 A * 9/1998 Yokozawa ............ F04D 29/582
415/176
(Continued)

FOREIGN PATENT DOCUMENTS

DE 28 44 672 A1 4/1980
DE 103 21 022 A1 12/2004
(Continued)

*Primary Examiner* — Adam B Dravininkas
(74) *Attorney, Agent, or Firm* — David S. Safran; Roberts Calderon Safran & Cole, P.C.

(57) ABSTRACT

A device for receiving an electronics assembly having a closed housing with a housing wall, at least one electronic component, a holder and a fan with a fan housing, wherein the electronic component, the holder and the fan are arranged within the housing, and the fan is arranged in the holder. To provide a device for receiving an electronics assembly that enables an alternative cooling of the electronics assembly in a closed housing is achieved in that the fan is designed as a revolving blade fan and by the fact that the fan generates a continuous air flow for cooling the electronic unit during operation.

10 Claims, 4 Drawing Sheets

(58) Field of Classification Search
CPC ......... H05K 7/20163; H05K 7/20181; H05K 7/205; H05K 7/20645
See application file for complete search history.

(56) References Cited

U.S. PATENT DOCUMENTS

| | | | | |
|---|---|---|---|---|
| 5,966,286 A * | 10/1999 | O'Connor | ............... | G06F 1/203 165/104.33 |
| 6,064,571 A * | 5/2000 | Noble | ............... | G06F 1/20 165/80.3 |
| 7,002,797 B1 * | 2/2006 | Wittig | ............... | H05K 7/20154 165/80.3 |
| 7,436,660 B2 * | 10/2008 | Pedoeem | ............... | H04L 41/024 361/690 |
| 7,617,019 B2 | 11/2009 | Leuschner | | |
| 9,545,037 B2 * | 1/2017 | Tyleshevski | ............... | H05K 7/206 |
| 9,795,067 B2 * | 10/2017 | Takezawa | ............... | H02M 7/003 |
| 10,028,414 B2 * | 7/2018 | Khandelwal | ............... | H05K 7/20572 |
| 2002/0134531 A1 * | 9/2002 | Yanagida | ............... | G06F 1/18 165/80.3 |
| 2004/0007348 A1 * | 1/2004 | Stoller | ............... | H02B 1/565 165/47 |
| 2008/0112130 A1 * | 5/2008 | Nakamura | ............... | G06F 1/203 361/679.49 |
| 2008/0239665 A1 * | 10/2008 | Franz | ............... | F04D 29/646 361/695 |
| 2011/0203770 A1 * | 8/2011 | Rowe | ............... | H05K 7/202 165/80.1 |
| 2012/0134114 A1 * | 5/2012 | Kamenszky | ............... | H05K 7/202 361/697 |
| 2012/0161596 A1 * | 6/2012 | Manahan | ............... | H02B 1/28 312/236 |
| 2015/0271950 A1 | 9/2015 | Hagiwara et al. | | |

FOREIGN PATENT DOCUMENTS

| | | |
|---|---|---|
| DE | 20 2004 007 075 U1 | 8/2005 |
| DE | 10 2012 110 001 A1 | 4/2014 |
| EP | 2 197 255 A1 | 6/2010 |
| JP | H07-100084 A | 4/1995 |
| WO | 2014060528 A1 | 4/2014 |

* cited by examiner

DEVICE FOR RECEIVING AN ELECTRONICS ASSEMBLY

BACKGROUND OF THE INVENTION

Field of the Invention

The invention relates to a device for receiving an electronics assembly comprising a closed housing with a housing wall, at least one electronic component, a holder and a fan with a fan housing, wherein the electronic component, the holder and the fan are arranged within the housing and wherein the fan is arranged in the holder.

Description of Related Art

It is known from the prior art to cool electronic components arranged in a housing by means of a fan during operation. For this, the housing usually has openings in order to allow an exchange of air between the housing interior and the environment. By using a fan, the warm air inside the housing can be removed from the housing.

However, there are applications in which the use of open housings is not possible. If the housing is subject to, for example, increased requirements with regard to explosion protection or with respect to the purity of the housing interior, the housing is designed to be closed. An air exchange with the environment for cooling the components arranged within the housing is not possible in this respect.

In this configuration, cooling takes place, for example, by the use of heat sinks arranged on the components that heat up. The heat sink conveys the heat loss affecting the components away from the components and releases it to the environment through convection.

Alternatively, the European Patent Application EP 2 197 255 A1 discloses a closed housing system in which the air of the housing interior is circulated by means of an oscillating membrane fan and thus conveyed away from local heat sources.

SUMMARY OF THE INVENTION

Based on the stated prior art, it is an object of the invention to provide a device for receiving an electronics assembly, which allows an alternative cooling of the electronics assembly in a closed housing.

According to the teachings of the invention, the object in respect to the aforementioned device is achieved in that the fan is designed as a revolving blade fan and that the fan generates a continuous, in particular steady, air flow for cooling the electronic component during operation.

According to the invention, it has been recognized that a revolving blade fan in a closed housing can be used to generate air flow in the form of a circulation, whereby cooling of the electronic components arranged inside the housing can be achieved. This has the advantage that a continuous and effective cooling can be ensured during operation. In particular, different galvanically isolated regions can be cooled by the use of the cooler according to the invention. The fan housing is preferably designed such that the intake air flow is diverted in a ducted manner. It is particularly advantageous when the fan is designed and arranged in such a manner that the air flow for cooling is routed along at least one cooling element, in particular the housing wall.

According to an advantageous configuration of the device, the electronic component is arranged on at least one printed circuit board. If several printed circuit boards are present, these are either grouped as a compact device insert or they are arranged separately, i.e. independently of one another, in the housing. In this case, the air flow during operation of the device is preferably conveyed between the circuit boards in such a way that the components on the circuit boards that heat up during operation are effectively cooled.

According to a further advantageous configuration, more than one printed circuit board is present and there is at least one preferably conductive connecting element for connection of and/or receiving the printed circuit boards, wherein the holder is connected to the connecting element. It is particularly preferred when the holder is detachably connected to the connecting element. Particularly preferably, the holder is positively connected to the connecting element. For this, the connecting element preferably has at least one recess for receiving the holder. Alternatively, the holder can also be connected via a screw connection with the connecting element. It is also conceivable that the holder is materially bonded to the connecting element or that the holder is designed in one piece with the connecting element.

The connecting element is preferably designed as a printed circuit board. Particularly preferably, the printed circuit board is arranged as a rear wall inside the housing next to the housing wall and, in particular, has slots for receiving a device insert consisting of printed circuit boards equipped with electronic components.

If a device insert or a plurality of independent printed circuit boards is connected to a printed circuit board designed as a rear wall, then the fan is preferably arranged such that the air flow at least partially flows between the printed circuit boards.

According to a further configuration, the fan is conductively connected to the circuit board and/or the connecting element for power supply. The connection is made for example by means of insulation displacement contacts.

According to a further configuration, the fan housing is at least partially made of a metal. It is advantageous when the material of the fan housing has a high thermal conductivity, so that the fan can be cooled via the fan housing.

In a further advantageous configuration of the device according to the invention, the fan housing is thermally coupled to the housing wall via a coupling means or the fan housing has direct contact with the housing wall. This has the advantage that the fan and thus the air flow can be cooled by the fan housing and the contact with the cool housing wall. This advantage results in particular when the material of the fan housing has a high thermal conductivity, i.e., for example, made of a metal. In the present case, direct contact means that no further components are arranged between the fan housing and the housing wall.

The coupling means preferably comprises a heat-conducting mat, a heat-conducting pad, a heat conduction paste or heat conduction adhesive.

In a further configuration, at least one ducting element, in particular in the form of an air duct, is provided, wherein the ducting element is arranged such that the air flow during operation flows from the fan via the ducting element into the housing. The air flow can be selectively guided by means of the ducting element to the electronic components, which heat up particularly strongly during operation. In this respect, this configuration has the advantage that a targeted controlled cooling of the electronics can take place. For example, the ducting element is designed as an air duct or as a ducted fan outlet.

A further configuration is wherein the ducting element is designed and arranged such that the ducting element extends at least partially along the housing wall. In this case, the ducting element can preferably run at a small distance parallel to the housing wall or have direct contact with the housing wall. This configuration has the advantage that a particularly effective cooling of the air flow in the region of the ducting element can be achieved. This is especially true when the ducting element has direct contact with the housing wall, because the heat absorbed by the air flow can be effectively dissipated via the housing by means of contact with the cool housing wall.

According to a further configuration, the ducting element is at least partially formed by the holder. This has the advantage that the ducting element is arranged directly on the fan.

In addition, it is advantageous when the ducting element is at least partially formed by the connecting element.

It is particularly preferred when a part of the ducting element is formed by the holder and the ducting element is completed by the connecting element.

According to a further configuration, the holder consists at least partially of a polymer. It is advantageous in general when the holder consists of a material with low thermal conductivity, because then, in the case in which the holder is in contact with the connecting element, no heat is transferred from the holder to the connecting element.

According to a next preferred configuration, a control unit, preferably a microcontroller, is provided, wherein the control unit regulates the speed of the fan during operation. In this case, the fan is preferably designed such that it can be regulated continuously or discretely. For example, the control unit is arranged on a printed circuit board.

It is particularly preferred that the control unit is designed such that it regulates the speed of the fan depending on the temperature inside the housing during operation. It is also particularly preferred that the control unit regulates the speed of the fan depending on the difference between the temperature inside the housing and the temperature outside the housing or a measured housing wall temperature.

According to a further configuration, the housing is designed as Ex-d housing. The housing thus meets special requirements in terms of explosion protection. For example, the housing is a transmitter housing for connection to a sensor unit.

In detail, there is a plurality of possibilities for designing and further developing the device according to the invention. For this, reference is made to both the patent claims subordinate to the independent patent claims as well as to the following description of preferred embodiments with reference to the accompanying drawings.

DETAILED DESCRIPTION OF THE INVENTION

Figure 1:
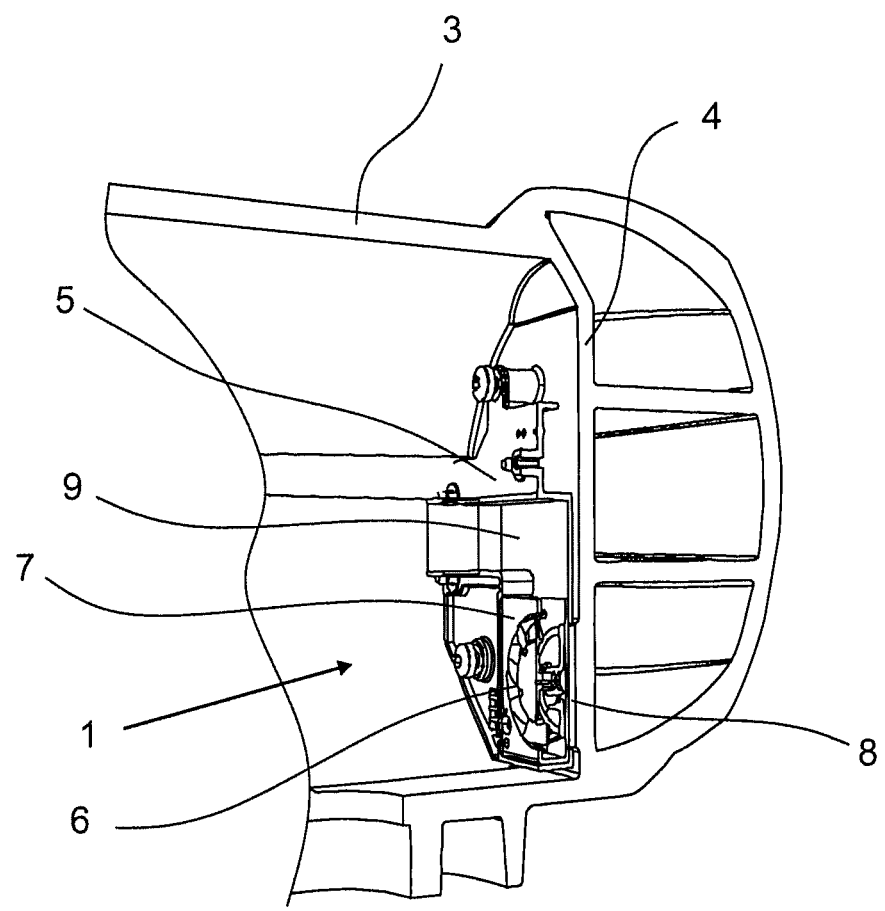
FIG. 1 is a sectional view of a first embodiment of the device according to the invention.

FIG. 1 shows a sectional view of a first embodiment of a device 1 for receiving an electronics assembly. A portion of an Ex-d (explosion proof) housing 3 is shown with a housing wall 4, a holder 5 and a fan 6 with a fan housing 7, wherein the fan 6 is arranged in the holder 5. For this, the holder 5 has a recess in which the fan 6 and the fan housing 7 are arranged. The fan 6 is a revolving blade fan 6 and generates a continuous air flow for cooling the electronics assembly (not shown in this figure) during operation.

The fan housing 7 is made of a metal. To dissipate the heat, the fan housing 7 is connected to the housing wall 4 via a heat-conducting mat 8.

In addition, a ducting element 9 is present in the form of an air duct 9, via which the flow of air flows from the fan 6 into the housing 3 during operation. In this case, the air duct 9 extends partially along the housing wall 4, whereby an effective cooling of the flow of air flowing through the air duct 9 is achieved.

Figure 2:
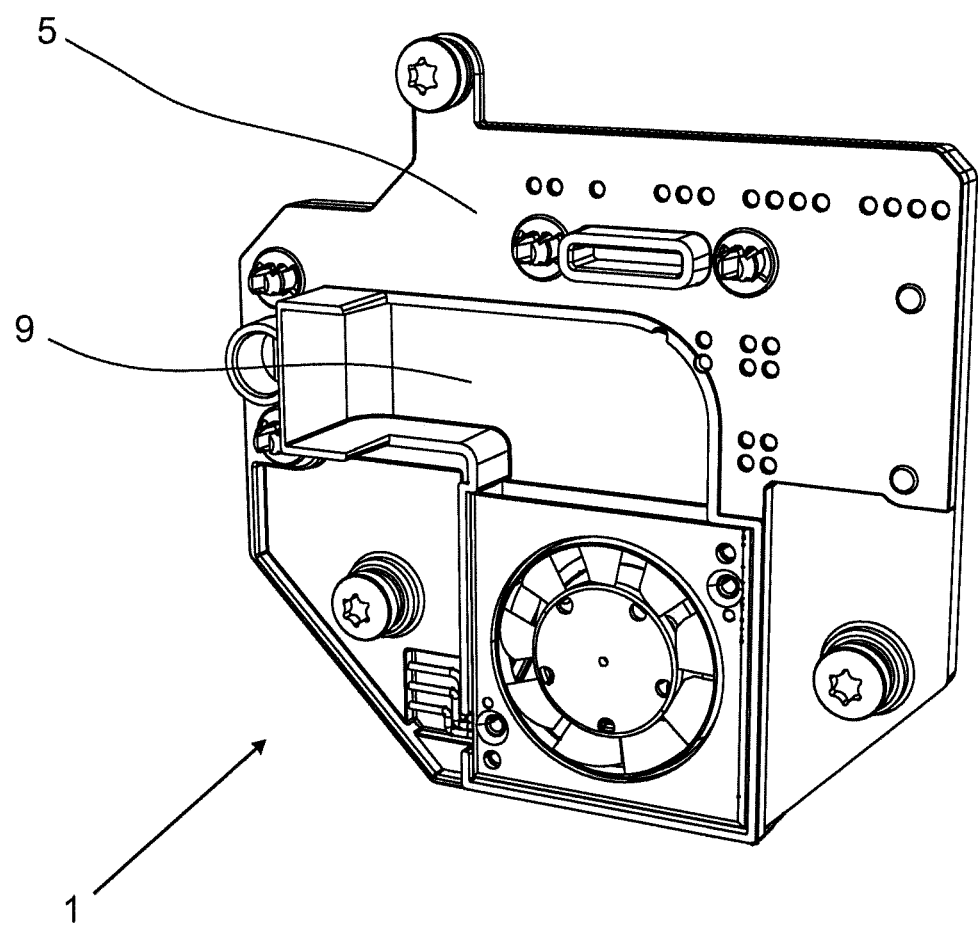
FIG. 2 is an illustration of the fan in the holder.

FIG. 2 shows an illustration of the fan 6 in the holder 5. The view shown in FIG. 2 demonstrates, in particular, the course of the air duct 9. The illustration shows that the air flow is first conveyed parallel to the housing wall 4 and then via the duct outlet into the housing interior.

Figure 3:
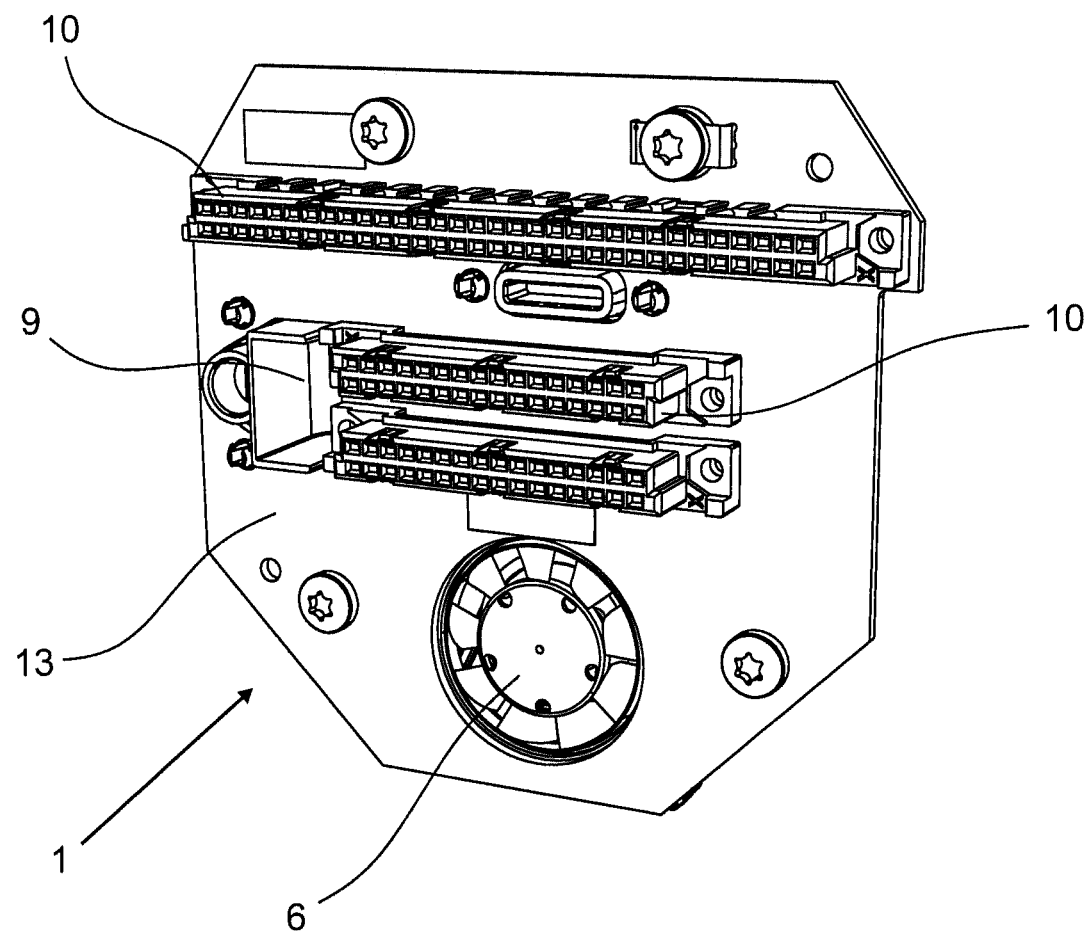
FIG. 3 is an illustration of the fan in the holder and the connecting element in the form of a printed circuit board.

FIG. 3 shows an illustration of the fan 6 in the holder 5 and the connecting element 13 in the form of a printed circuit board. The circuit board is detachably connected to the holder 5 in that the holder 5 is clipped into the circuit board.

In addition, the fan 6 is conductively connected to the circuit board for power supply and for control using insulation displacement contacts. The air duct 9 is partially formed by the holder 5, as shown in FIGS. 1 and 2, and completed by the circuit board. In this case, the holder 5 is made of a polymer to prevent heat transfer from the holder 5 to the circuit board.

The printed circuit board shown is designed for use as a back wall within the housing and has slots 10 for receiving a device insert 11 comprised of further printed circuit boards 2 equipped with electronic components.

Figure 4:
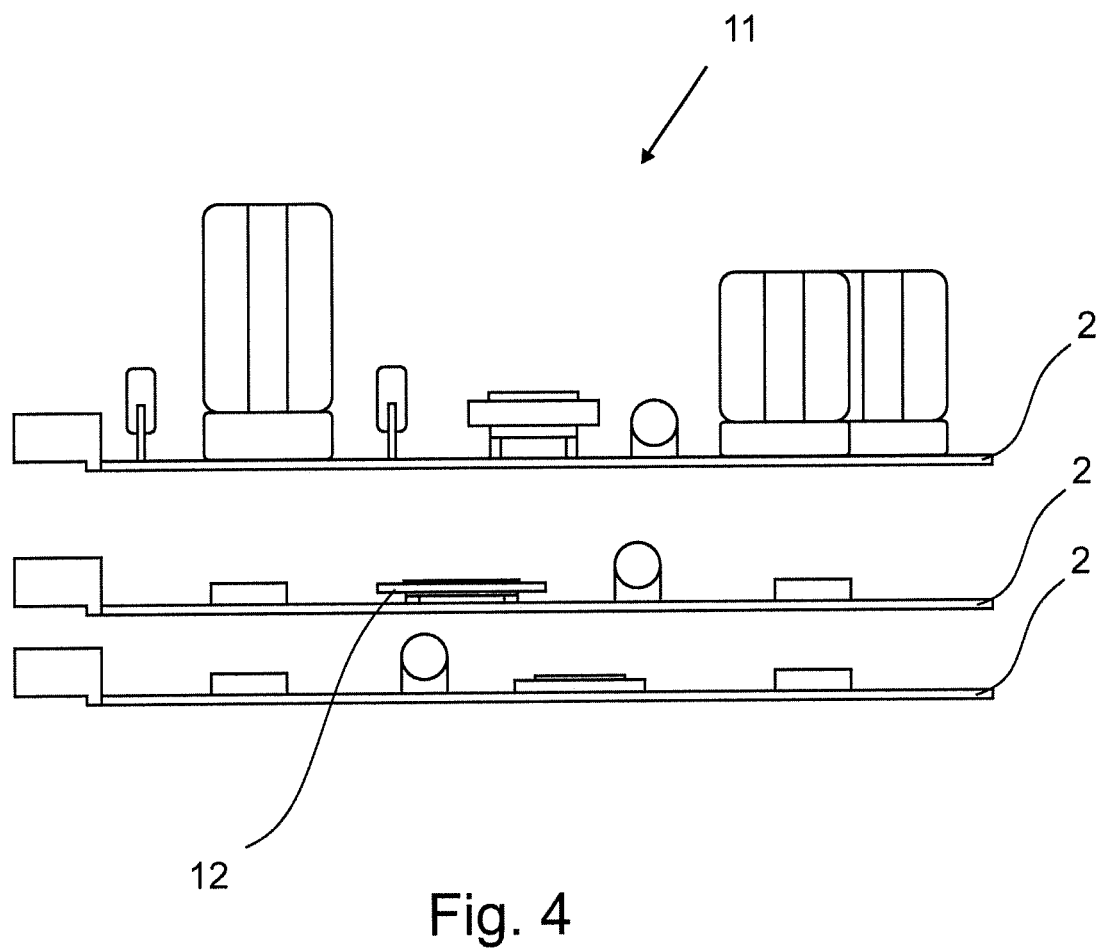
FIG. 4 is a device insert for connection to the printed circuit board.

Such a device insert 11 composed of several printed circuit boards 2 equipped with electronic components is shown in FIG. 4. A control unit 12 is also arranged on the device insert 11 in the form of a microcontroller, which controls the speed of the fan 6 in dependence on the temperature within the housing 3.

What is claimed is:

1. A device for receiving an electronics assembly comprising:
   a closed housing with a housing wall,
   at least one electronic component,
   a holder and
   a fan with a fan housing,
   wherein the electronic component, the holder and the fan are arranged within the closed housing,
   wherein the fan is arranged in the holder,
   wherein the fan is a revolving blade fan that generates a continuous air flow circulation within the housing for cooling the electronic component during operation,
   wherein the electronic component is arranged on at least two printed circuit boards and wherein at least one connecting element is present for at least one of connecting or receiving the printed circuit boards, and wherein the holder is connected to the connecting element,
   wherein at least one ducting element is present, the ducting element being arranged such that a flow of air from the fan flows into the closed housing via the ducting element during operation, wherein the ducting element is formed at least partly by the holder, and wherein the ducting element is formed at least partly by the connecting element.

2. The device according to claim 1, wherein the fan is connected in a conductive manner to the printed circuit board and/or the connecting element.

3. The device according to claim 1, wherein the fan housing at least partially formed of a metal.

4. The device according to claim 1, wherein the fan housing is thermally coupled to the housing wall via a coupling means.

5. The device according to claim 4, wherein the coupling means comprises one of a heat conduction mat, a heat conduction pad or a heat conduction paste located between the fan housing and the housing wall so that the air flow can be cooled by contact with the housing wall.

6. The device according to claim 1, wherein the ducting element is constructed and arranged such that the ducting element extends at least partially along the housing wall.

7. The device according to claim 1, wherein the holder at least partially is made of a polymer.

8. The device according to claim 1, further comprising a control unit, wherein the control unit regulates the speed of the fan during operation.

9. The device according to claim 8, wherein the control unit is adapted for regulating the speed of the fan during operation in dependence on the temperature within the housing.

10. The device according to claim 1, wherein the housing is an Ex-d housing, such that air exchange with the environment for cooling components arranged within the housing is not possible.

\* \* \* \* \*